(12) United States Patent
Chen et al.

(10) Patent No.: US 7,709,344 B2
(45) Date of Patent: May 4, 2010

(54) INTEGRATED CIRCUIT FABRICATION PROCESS USING GAS CLUSTER ION BEAM ETCHING

(75) Inventors: Shyng-Tsong T. Chen, Patterson, NY (US); John A. Fitzsimmons, Poughkeepsie, NY (US); Shom S. Ponoth, Fishkill, NY (US); Terry A. Spooner, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 1004 days.

(21) Appl. No.: 11/164,423

(22) Filed: Nov. 22, 2005

(65) Prior Publication Data

US 2007/0117342 A1   May 24, 2007

(51) Int. Cl.
*H01L 21/76* (2006.01)
(52) U.S. Cl. ............... 438/401; 438/687; 438/689; 257/E21.583
(58) Field of Classification Search ............ 438/401
See application file for complete search history.

(56) References Cited

U.S. PATENT DOCUMENTS

| | | | |
|---|---|---|---|
| 5,814,194 A | 9/1998 | Deguchi et al. | |
| 6,147,002 A | 11/2000 | Kneer | |
| 6,331,227 B1 | 12/2001 | Dykstra et al. | |
| 6,375,790 B1 | 4/2002 | Fenner | |
| 6,486,478 B1 | 11/2002 | Libby et al. | |
| 6,613,240 B2 | 9/2003 | Skinner et al. | |
| 6,624,081 B2 | 9/2003 | Dykstra et al. | |
| 6,750,460 B2 | 6/2004 | Greer | |
| 6,805,807 B2 | 10/2004 | Fenner | |
| 2003/0073314 A1* | 4/2003 | Skinner et al. | 438/689 |
| 2003/0181050 A1* | 9/2003 | Hu et al. | 438/694 |
| 2005/0042800 A1 | 2/2005 | Yamada et al. | |
| 2005/0272265 A1* | 12/2005 | Geffken et al. | 438/706 |
| 2006/0105570 A1* | 5/2006 | Hautala et al. | 438/687 |

FOREIGN PATENT DOCUMENTS

| | | |
|---|---|---|
| JP | 2003282384 | 10/2003 |
| JP | 2003249426 | 2/2005 |

(Continued)

OTHER PUBLICATIONS

White, B., Book, G., Hautala, J., Tabat, M.,IEEE Xplore Release 2.5, Ultra low-k integration solutions using GCIB processin, publication date: Jun. 7-9, 2004, ISBN: 0-7803-8308-7, INSPEC Accession No. 8109596, pp. 193-195.

(Continued)

*Primary Examiner*—Matthew Smith
*Assistant Examiner*—Walter H Swanson
(74) *Attorney, Agent, or Firm*—Wenjie Li; Greenblum & Bernstein P.L.C.

(57) ABSTRACT

A method comprises depositing a dielectric film layer, a hard mask layer, and a patterned photo resist layer on a substrate. The method further includes selectively etching the dielectric film layer to form sub-lithographic features by reactive ion etch processing and depositing a barrier metal layer and a copper layer. The method further includes etching the barrier metal layer and hard mask layer by gas cluster ion beam (GCIB) processing.

15 Claims, 13 Drawing Sheets

FOREIGN PATENT DOCUMENTS

WO  WO0106538 A1  1/2001

OTHER PUBLICATIONS

Noriaki Toyoda, Shinji Matsui and Isao Yamada, JJAP, Ultra-Smooth Surface Preparation Using Gas Cluster Ion Beams, Jpn. J. Appl. Phys. 41 (2002) pp. 4287-4290. ISSN 1347-4065.

Pending U.S. Appl. No. 10/730,892, filed Dec. 10, 2003 entitled "Field Effect Transistor With Etched-Back Gate Dielectric".

Pending U.S. Appl. No. 10/711,145, filed Aug. 27, 2004 entitled "Maintaining Uniform CMP Hard Mask Thickness".

Pending U.S. Appl. No. 10/906,013, filed Jan. 31, 2005 entitled "Reducing Wire Erosion During Damascene Processing".

* cited by examiner

INTEGRATED CIRCUIT FABRICATION PROCESS USING GAS CLUSTER ION BEAM ETCHING

FIELD OF THE INVENTION

The invention generally relates to the field of semiconductor fabrication, and more particularly, to an integrated fabrication process of etching and smoothing surfaces using gas cluster ion beam (GCIB) etching.

BACKGROUND DESCRIPTION

Surfaces of microelectronic materials such as semiconductors, dielectrics, and metals (often as thin films on a substrate) are generally planarized after their fabrication. The close proximity of microelectronic components, either as multiple layers or as interacting and interconnected subcomponents, requires a high degree of uniformity of the surface. Advances in semiconductor technology have seen the advent of very large scale integration (VLSI) and ultra large scale integration (ULSI) circuits, resulting in the integration of very many more devices in smaller areas on a semiconductor substrate.

The greater device densities require greater degrees of planarity to permit the higher resolution lithographic processes required to form the greater number of devices having smaller features as incorporated in current designs. That is, as successive generations of improvements in semiconductor fabrication are implemented, the tolerance for scratches, erosion, contamination, or other imperfections in the smoothed surface becomes smaller.

One such method of planarization is by chemical mechanical polishing (CMP). CMP, though, is limited because the physical polish often generates scratches, erosion, or other surface defects on the wafer surface. Additionally, the polish rate depends upon the pattern density factor; thus the longer the polish, the worse the uniformity. This non-uniformity of the surface is not within the acceptable tolerances for processing the very thin wire levels of emerging fabrication methods. Also, for fatwire levels, a thick CMP hard mask is often required in the film stack to be sure that some hard mask remains after CMP, if desired.

FIG. 1 shows a graph of the line resistance distribution of multiple chips on twelve wafers—each chip has nested lines with widths of 2.5 µm, 6 µm, 15 µm, and 25 µm, and having 50% pattern density—formed using a conventional CMP process. Along the x-axis are the wafer IDs, and along the y-axis is the line resistance in Ohms. As will be appreciated by one skilled in the art, it is desirable to have uniformity of resistance across the wafer in order to optimize performance. The four different lines on the graph show the resistance varies considerably across each wafer.

Thus, it is desirable to achieve a more planar and smoothed surface, with extremely uniform line resistance across the wafer, even when the surface includes complex structures.

SUMMARY OF THE INVENTION

In a first aspect of the invention a method comprises depositing a dielectric film layer, a hard mask layer, and a patterned photo resist layer on a substrate. The method further includes selectively etching the dielectric film layer to form sub-lithographic features by reactive ion or GCIB etch processing and depositing a barrier metal layer and a copper layer. The method further includes etching the barrier metal layer and hard mask layer by gas cluster ion beam (GCIB) processing.

In a second aspect of the invention a method comprises performing a reactive ion etch step to selectively etch a dielectric film layer to form sub-lithographic features. The method further includes depositing metal layers on the dielectric film layer and polishing at least one of the metal layers to remove excess material from a surface with recess in metal lines. The method further includes performing a gas cluster ion beam (GCIB) etch to remove an exposed portion of one of the metal layers and a hard mask layer.

In a third aspect of the invention a system, such as a device, comprises a smoothed surface with variations and roughness of less than 1 nm (nanometer) in height across the chip.

DETAILED DESCRIPTION OF EMBODIMENTS OF THE INVENTION

The invention is generally directed to a system and method of etching and smoothing of surfaces during semiconductor fabrication by the process of gas cluster ion beam (GCIB) etching. GCIB etching by the method of the present invention achieves a uniform planar smoothed surface (compared to conventional processes), having extremely uniform line resistance across the wafer. In comparison with existing methods of smoothing of surfaces, the inventive process is more easily controlled than, for example, reactive ion etching (RIE). Additionally, the inventive process produces a more uniform and scratch-free surface, without dependency on pattern density, than conventional chemical mechanical polishing (CMP). In particular, the method of the present invention is well suited to application on surfaces that include complex structures such as very large scale integration and ultra large scale integration. The method of the present invention may produce a smoothed surface with variations and roughness of less than 1 nm in height across the chip.

Figure 1:
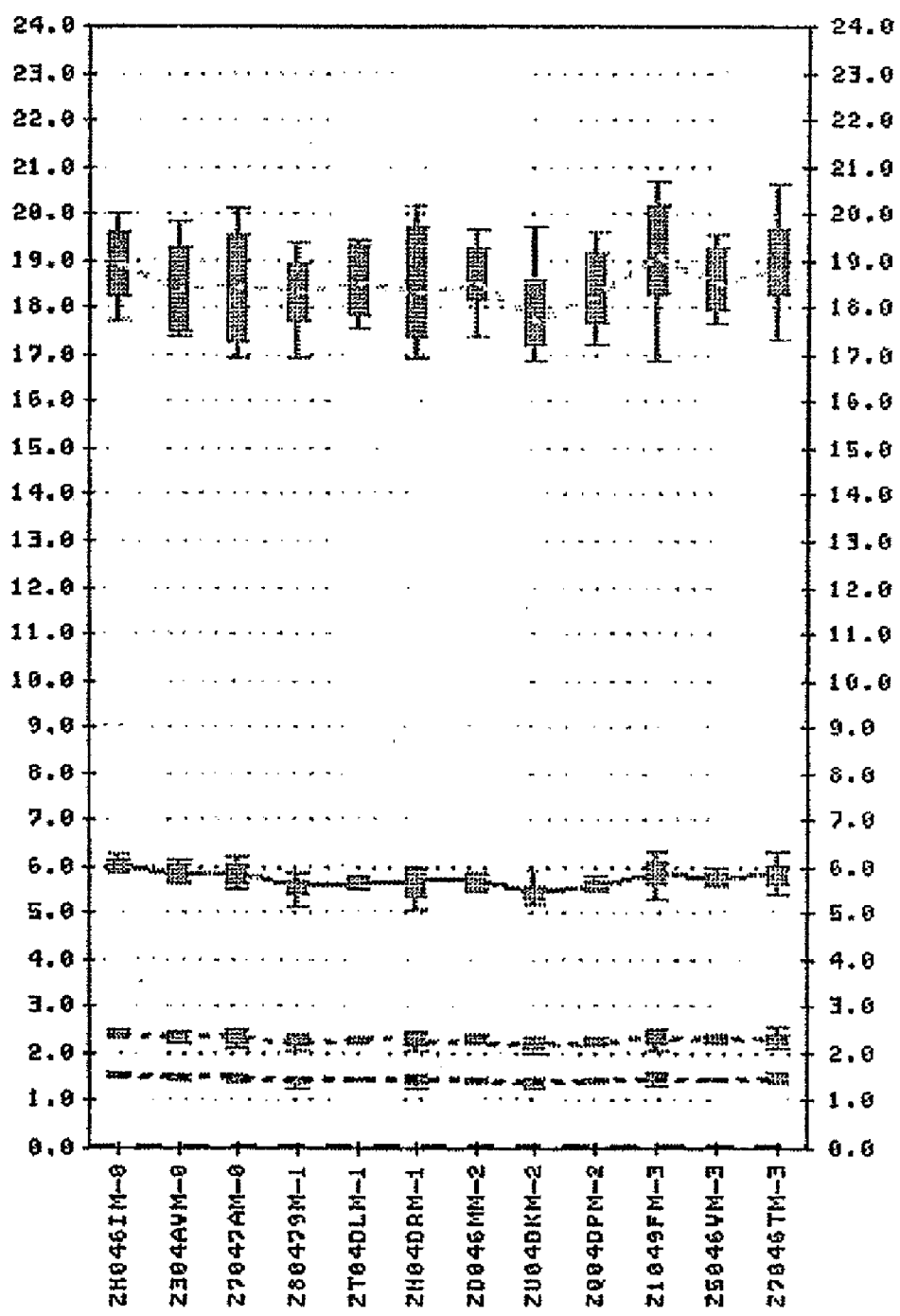
FIG. 1 is a graph showing the line resistance of nested lines formed using a conventional CMP process.
Figure 2:
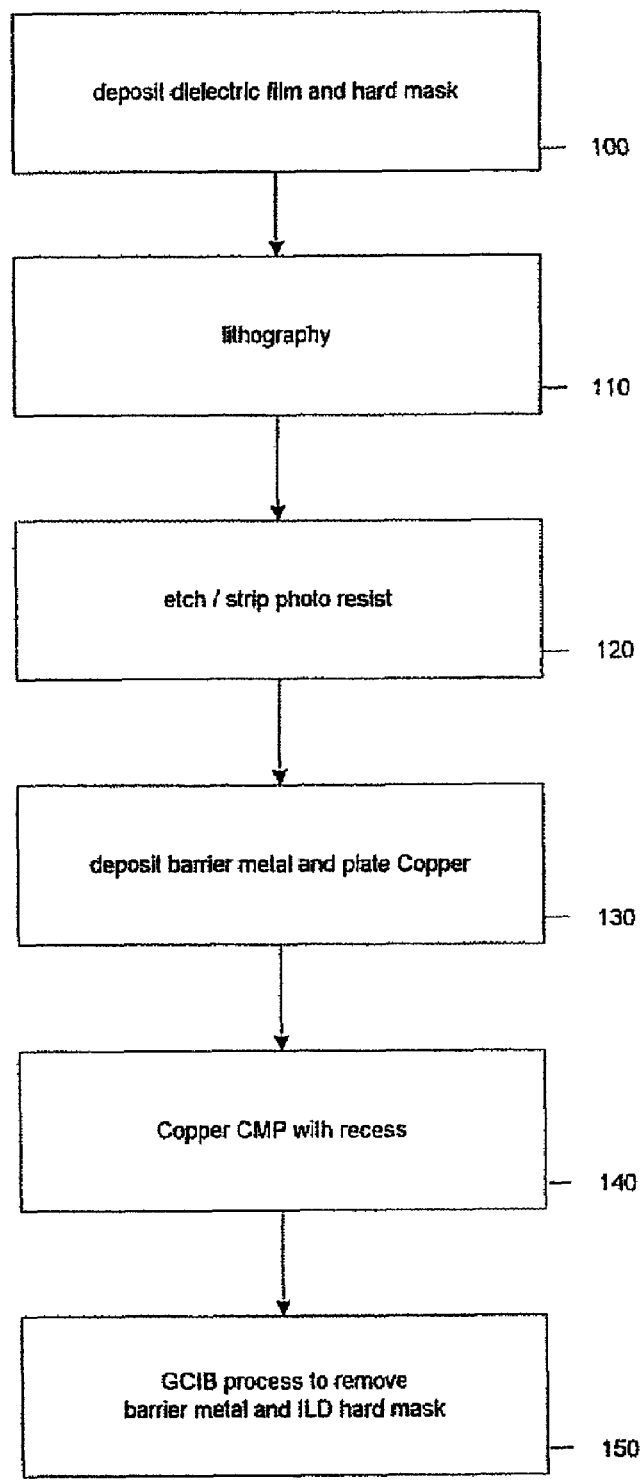
FIG. 2 is a flow diagram of an embodiment of the invention.

FIG. 2 is a flow diagram of an embodiment of the invention, generally denoted by reference numeral 100. The methods of the invention require one new manufacturing GCIB process step 150 but eliminate one barrier metal CMP step, but do not introduce new materials into the final build, and further avoid many of the shortcomings of existing CMP planarization processes.

Being more specific and referring to FIG. 2, in one embodiment of the invention, at step 100, an inter-level dielectric film layer is deposited on a substrate and a hard mask is deposited on the inter-level dielectric film layer. At step 110, an Anti-Reflective Coating (ARC®) layer is deposited on the hard mask layer and a block patterned photo resist layer is deposit on the ARC layer. At step 120, a reactive ion or GCIB etch step is performed to selectively etch the inter-level dielectric film layer to form sub-lithographic features. At step 130, a barrier metal layer and a copper layer 130 are deposited. At step 140, a chemical mechanical polish (CMP) is performed to remove excess copper from the surface with controlled recess in the Copper line. At step 150, a gas cluster ion beam etch step is performed to remove the exposed barrier metal layer and hard mask layer. Each of these steps is discussed herein in greater detail.

Figure 3:
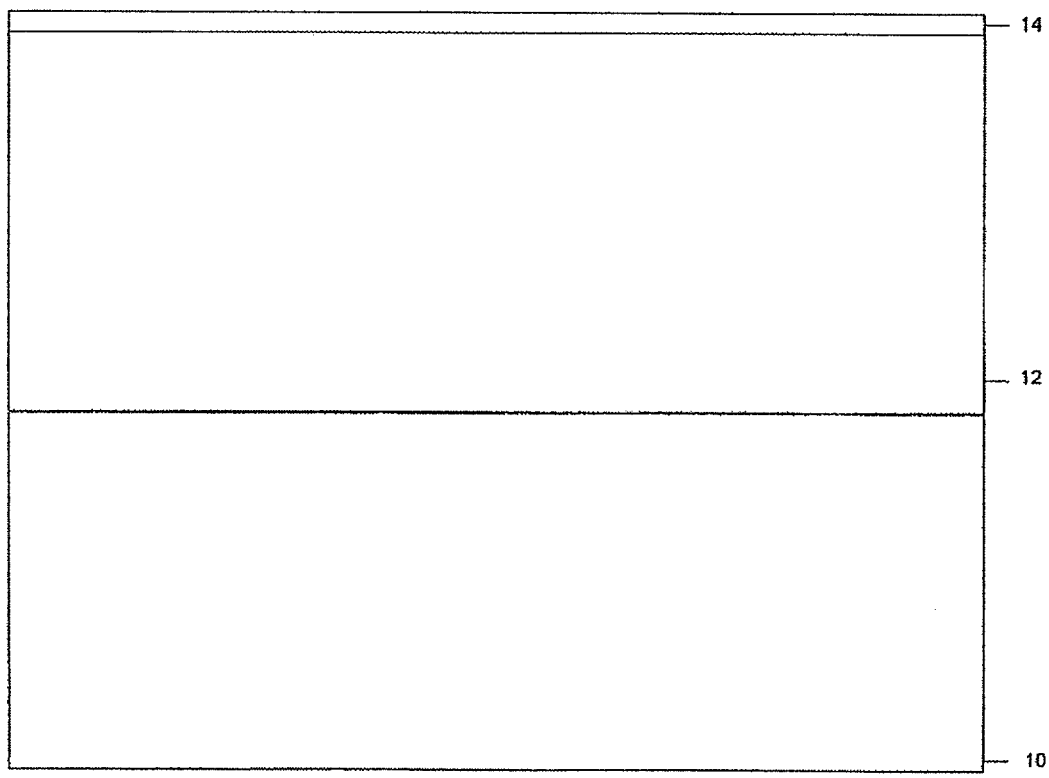
FIGS. 3-8 are representative of sectional schematic views of processing step(s) in accordance with the invention (not to scale)

FIG. 3 is a sectional schematic view of a substrate (not to scale), generally denoted by reference to numeral 10. In FIG. 3 an inter-layer dielectric film 12 is deposited on a substrate 10. The substrate 10 may be any conventional material such as, for example, Silicon.

The inter-layer dielectric film 12 is deposited on the substrate 10 using any known method such as, for example, plasma enhanced chemical vapor deposition (PECVD), chemical vapor deposition (CVD), spin-on coating or other processes. The inter-layer dielectric film 12 may be a dense or porous CVD or spin-on material with dielectric constant (K) ranging from 1.5 to 4.5, such as, for example, dense or porous Silicon Dioxide ($SiO_2$), Silicon Oxycarbide (SiCOH), or Methylsilsesquioxane (MSQ). The dielectric constant (K) may also range upwards to 7.5. For a high-performance chip, the inter-layer dielectric film 12 will preferably have a low dielectric constant (K), ranging from 1.5 to 2.5.

Additionally, FIG. 3 shows depositing a hard mask 14 on the inter-layer dielectric film 12. The step of depositing a hard mask 14 is not required, but may be preferable when using a very low K inter-layer dielectric film 12 in order to sustain the lithography rework. The hard mask 14 also sometimes serves as a CMP stopping layer.

Although the structure shown in FIG. 3 is a single-level structure, i.e. single level wiring layer, shown for illustrative purposes, it should be understood by those of skill in the art that the structure shown and described herein can be a multi-level structure of several layers. The methods of manufacturing described herein are equally applicable to such a multi-level structure.

Figure 4:
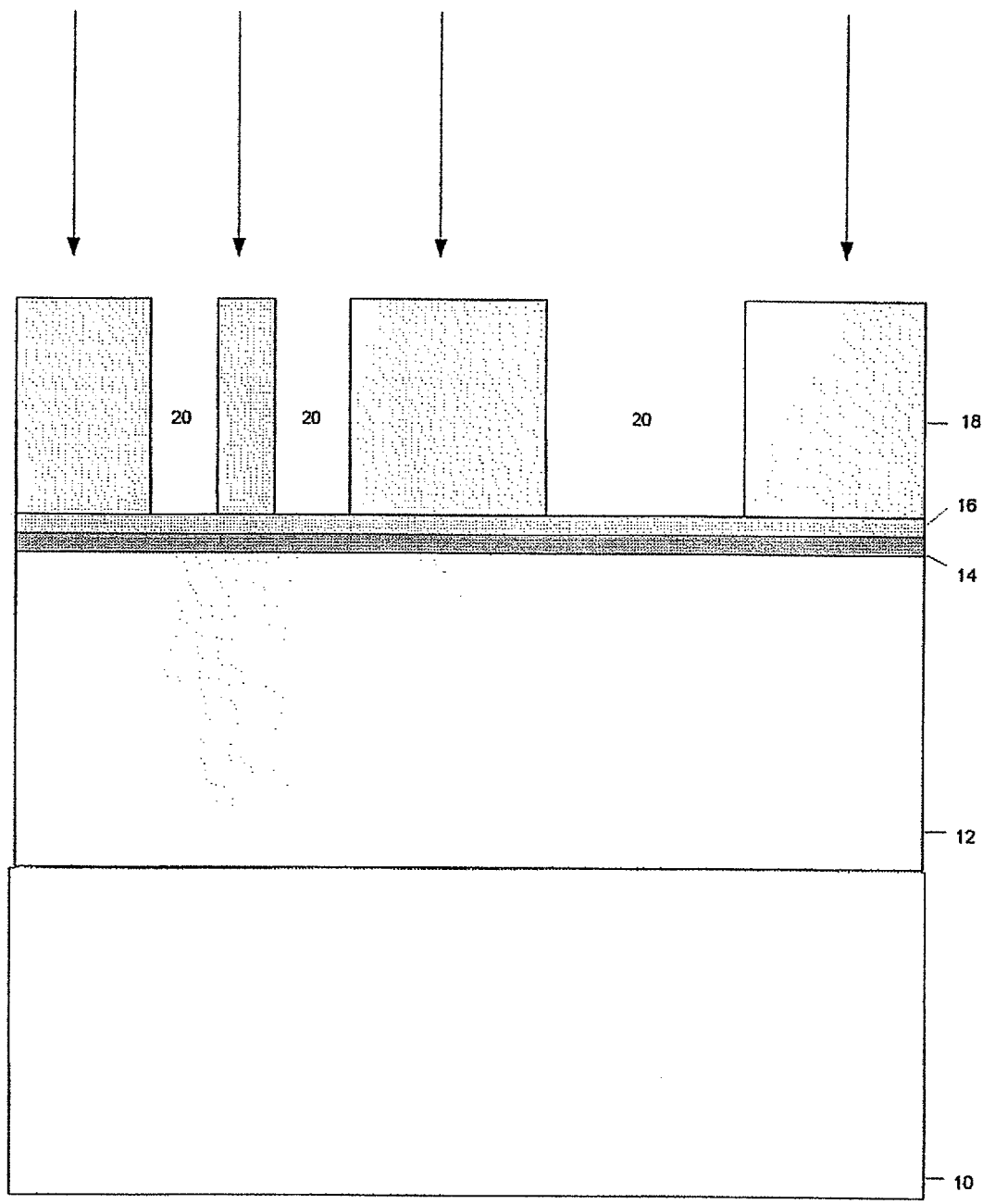

In FIG. 4, an Anti-Reflective Coating (ARC®) layer 16 and a blockout patterned photo resist layer 18 are deposited. The photo resist layer 18 may be deposited in any conventional manner, and may be any conventional photo resist material. The lithography process will preferably use a wavelength and a photo resist material that is suitable for the desired line width and pitch. The photo resist layer 18 may include holes 20 or features that are larger than the minimal resolution features; that is, in one implementation, the features of the photo resist layer 18 are larger that the spacings between the interconnects.

Figure 5:
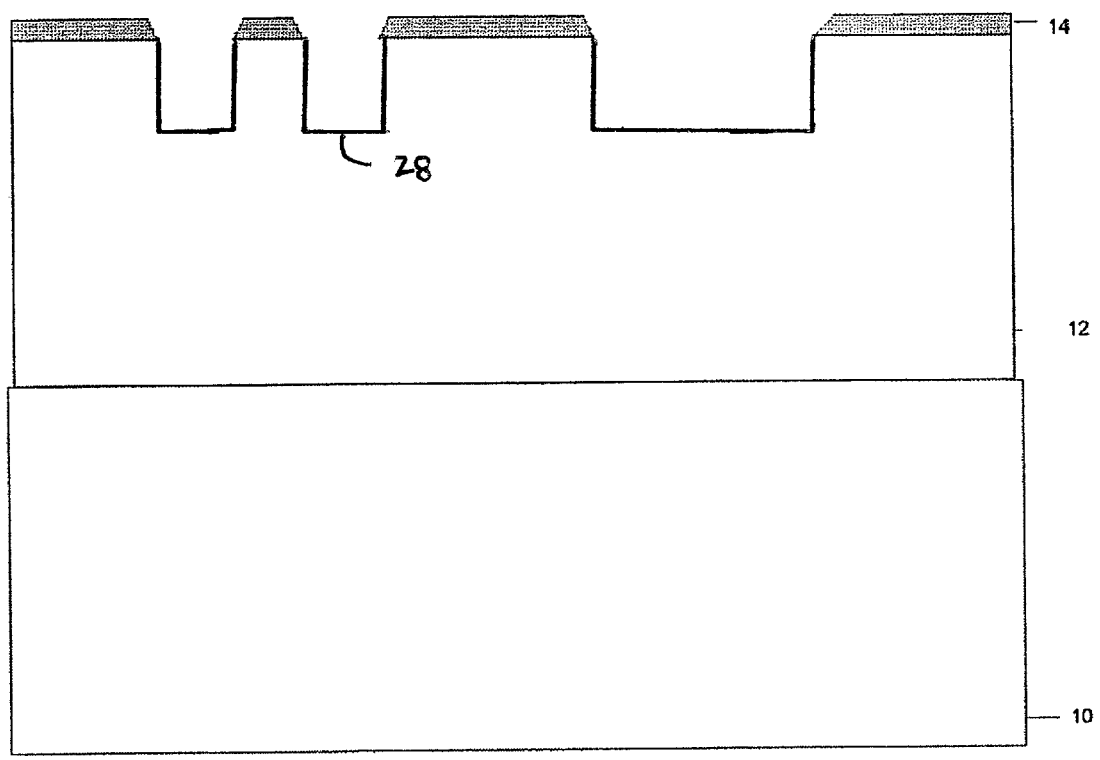

FIG. 5 illustrates a further step, which includes performing a reactive ion etch (RIE) or GCIB etch. In this step, the etch process opens up the ARC® layer 16 and the hard mask 14, and then etches into the inter-layer dielectric film 12 to a targeted depth 28. Finally, the etch process uses photo resist strip chemistry to strip away the remaining photo resist layer 18 and any remaining ARC® layer 16.

Figure 6:
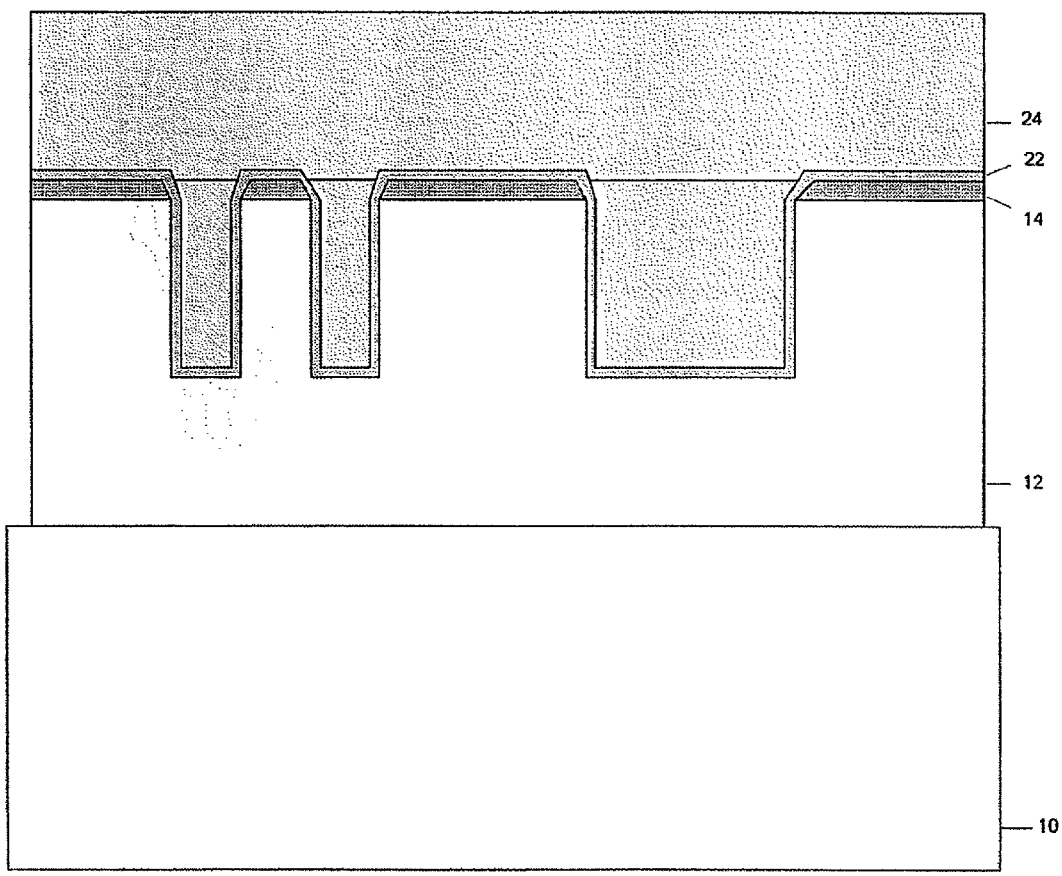

In FIG. 6, a barrier metal layer 22 and a copper layer 24 is deposited. The barrier metal layer 22 may be, for example, Tantalum (Ta), Tantalum Nitride (TaN), or Ruthenium (Ru). The barrier metal layer 22 may be deposited by any conventional method, such as, for example, chemical vapor deposition (CVD), physical vapor deposition (PVD), or atomic layer deposition (ALD). The copper layer 24 may be deposited by any conventional method, as should be understood by those of skill in the art.

Figure 7:
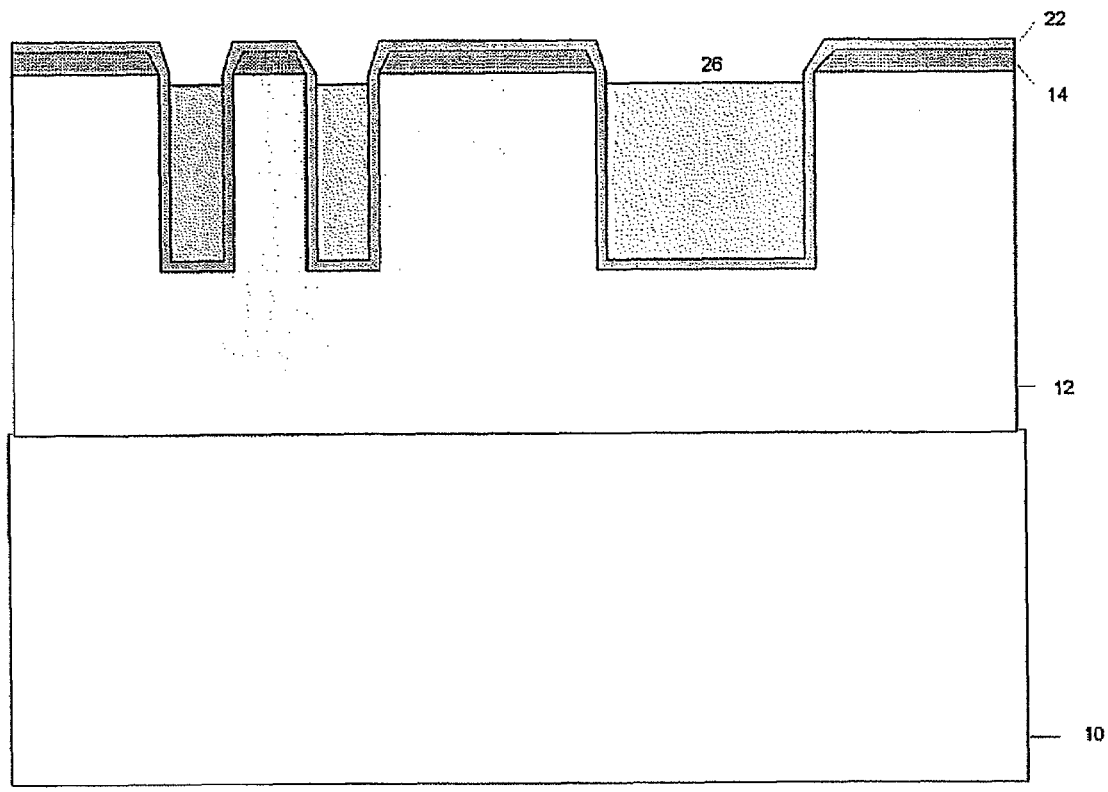

FIG. 7 illustrates a further step in the fabrication process of the invention. In FIG. 7, a copper CMP process is performed, leaving a recess 26. In this step, the excess copper may be removed from the surface by conventional Cu CMP means. Preferably, this polishing process will have good barrier metal/copper selectivity, such that the copper line will be recessed by about 500 Å without removing the barrier metal layer 22. Certain barrier metals such as Ruthenium (Ru) can withstand conventional copper CMP and prevent erosion of the hard mask layer 14 during the Copper CMP.

Figure 8:
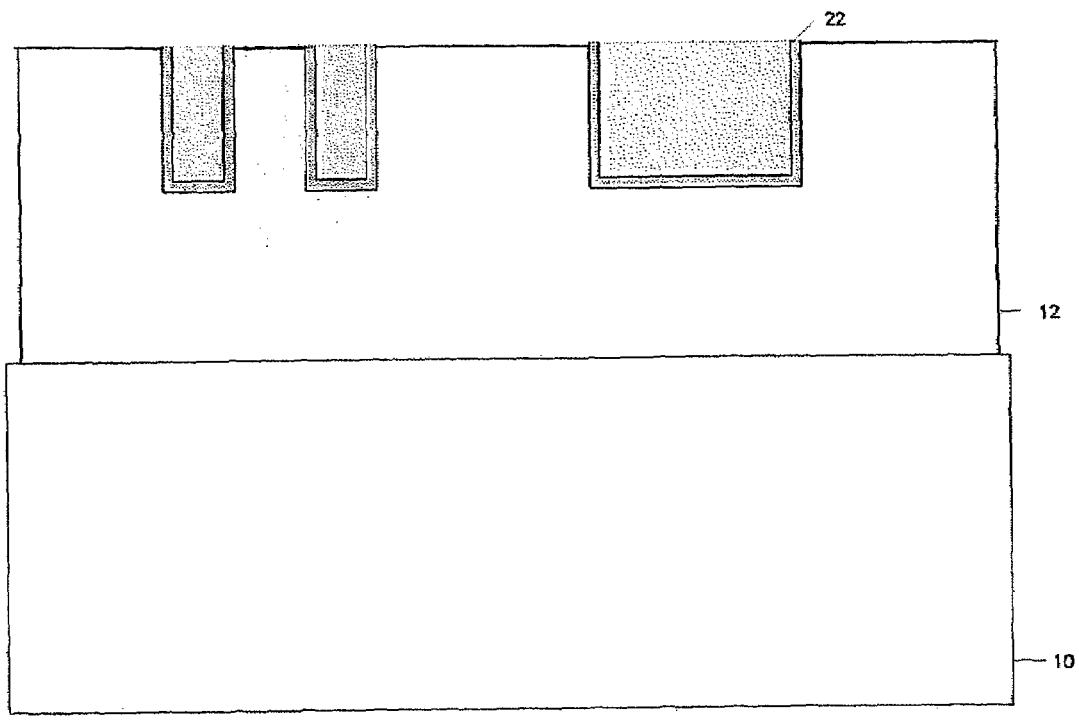
Figure 8:
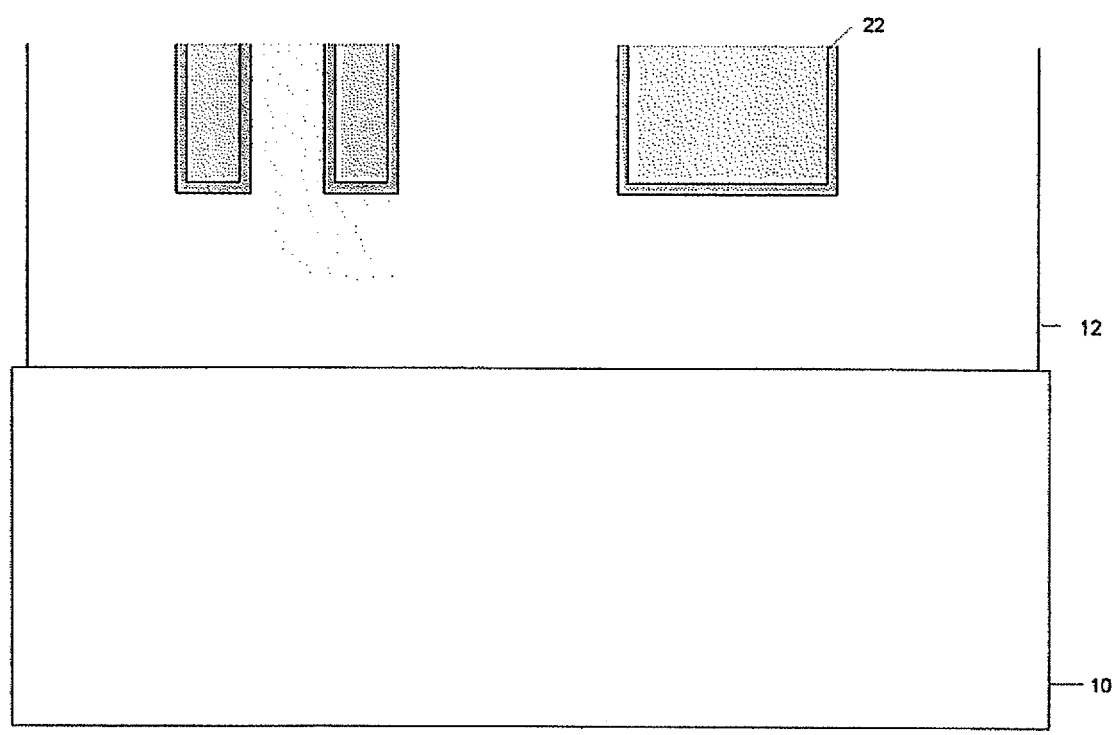

FIG. 8 is a sectional schematic view of a substrate (not to scale) in a further step of the inventive process. FIG. 8 illustrates a GCIB etching, during which the exposed barrier metal layer 22 and hard mask layer 14 are removed from the upper surface. In this invention, it has been found that the GCIB provides exceptional planarity with SiCOH and SiNCH surfaces coplanar with a complex metal sandwich of multiple components that may include Ru, Ta, TaN, and Cu. Furthermore, in the invention, there are multiple dimensional shapes, all of which create unique challenges in the polishing processes. As will be appreciated by one of skill in the art, materials having different pattern densities have different polishing rates, such that when using a CMP process, the different pattern densities and polishing rates must be taken into account. In the present invention, such differences need not be taken into account, because the GCIB etching process may be selected such that it does not etch the upper surface of the Copper in the trench. In this way, the present invention can be used to smooth the upper surface—even where that surface comprises complex geometries—in order to achieve planar uniformity to within 1 nm variations in height across the wafer. This degree of tolerance is not possible using CMP.

In the GCIB process, beams composed of clusters of gas atoms, roughly 5,000 to 20,000 atoms in each cluster, can be singly ionized, accelerated, and upon impact with a surface provide superior smoothness of the upper surface. The GCIB process has many advantages over CMP and other planarization methods in several important respects. In particular, the vacuum environment of the ion-beam apparatus provides contamination control for the work piece surface that cannot be attained with any wet or atmospheric-based methods. By using the GCIB process, the ion cluster beam (dry) etches, i.e., sputters, away the surface and will reduce the roughness of the surface and within-wafer and wafer-to-wafer uniformity to a much greater extent than the CMP. Also, by employing GCIB etching, the surface will not suffer plasma damage if the inter-layer dielectric film 12 is porous and has a low dielectric constant (K).

In the present invention, the GCIB etching process will preferably be performed with an ion dose of approximately between 0.5 and 2.5 $E^{15}$ ion-clusters/$cm^2$. The gas used in the GCIB process may be composed of a reactive gas, such as, for example but not limited to, Nitrogen Trifluoride ($NF_3$), Sulfur Hexaflouride ($SF_6$), Chlorine ($Cl_2$), in combination with a carrier gas, such as, for example but not limited to, Nitrogen ($N_2$), or Oxygen ($O_2$) and Argon (Ar). For the reactive gas, Nitrogen Triflouride may be preferred because Sulfur Hexaflouride is malodorous, and Chlorine is corrosive. The proportion of reactive and carrier gasses may be approximately 1% to 100%. In a preferred embodiment, the proportion of reactive gas may be approximately 1 to 10%, with the remaining 99 to 90% comprising the carrier gas.

Figure 9:
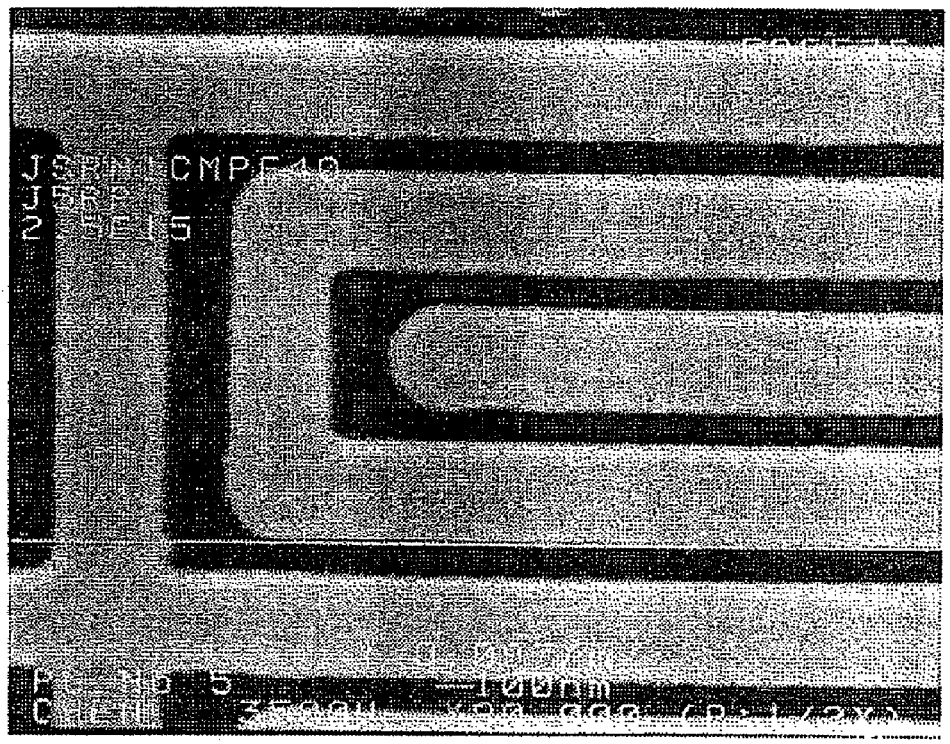
FIGS. 9-11 depict structures formed by the inventive process.
Figure 9:
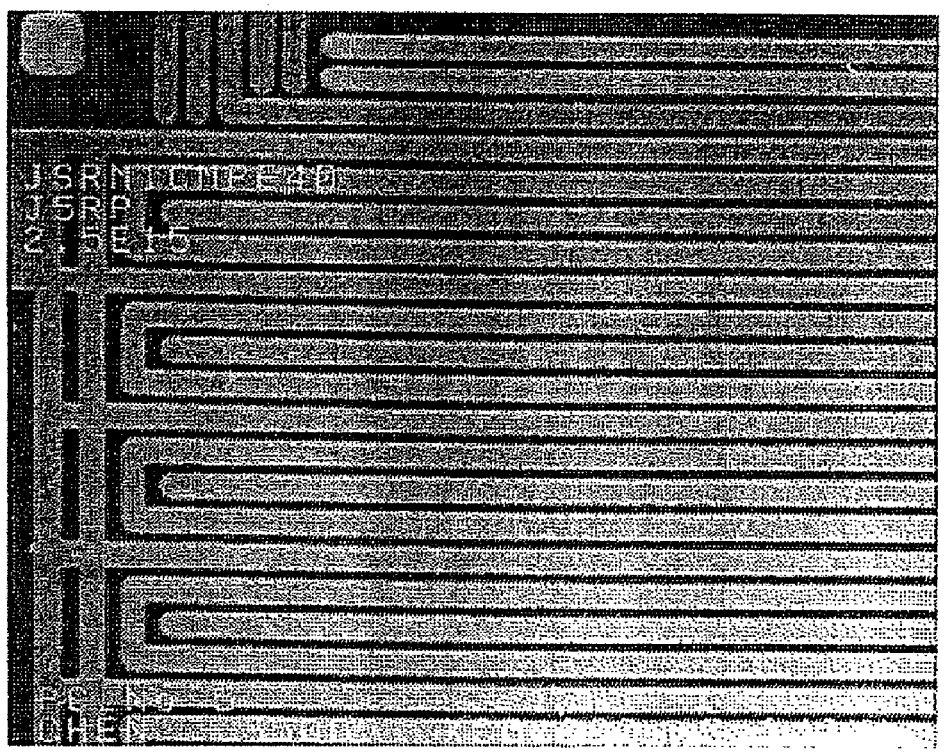
Figure 10:
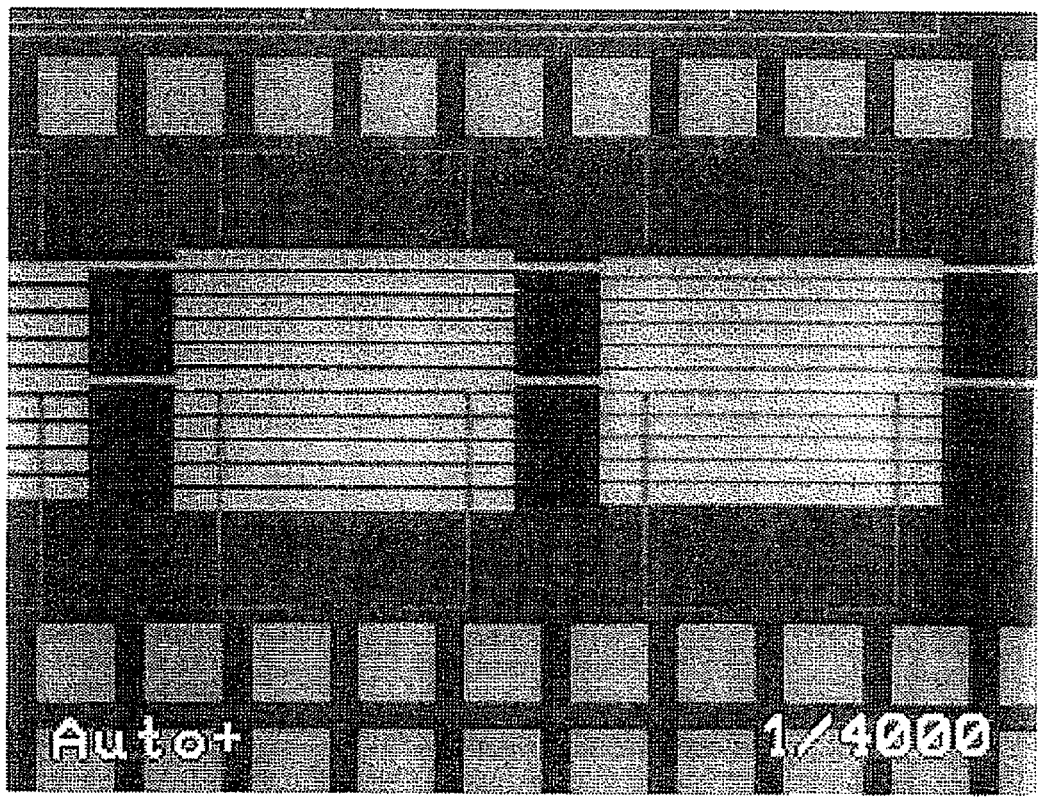
Figure 11:
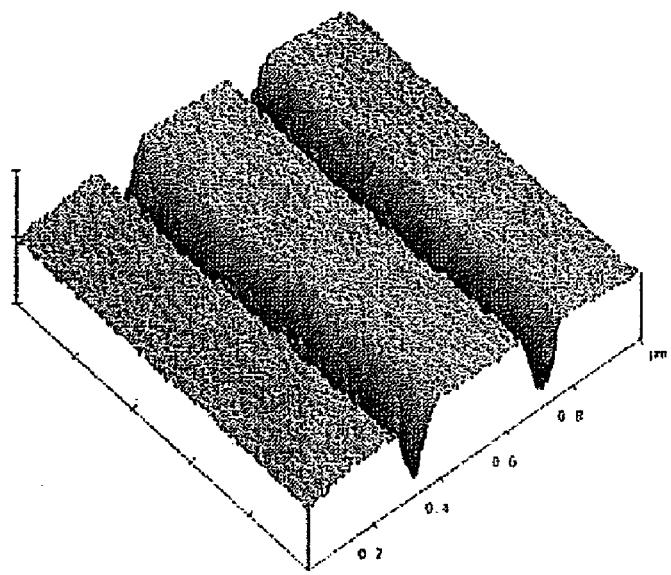
Figure 11:
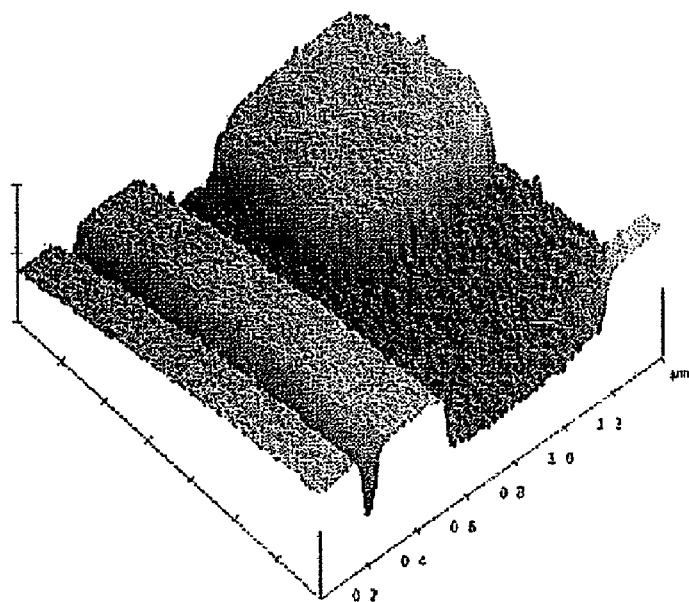

FIGS. 9-11 show a structure formed by the inventive process. As will be appreciated by one skilled in the art, these figures show a scratch-free surface with smooth line edges. These structures are representative of a smoothed surface with variations of less than 1 nm in height across the chip. As can be seen from FIGS. 9-11, there is no evidence of scratches on the metal, nor of erosion of the dielectric layer, even for 25 µm wide lines having 95% pattern density. The structures shown in FIGS. 9 and 10 were created using an ion cluster dose of approximately 2.5 $E^{15}$ ion-clusters/$cm^2$. The image in FIG. 11 is of a structure without Cu line recess after GCIB removal of the Ta/TaN barrier metal layer. The image in FIG.

11 was created with a scan size of 1.000 µm and a scan rate of 0.8003 Hz; 256 samples were taken. In FIG. 11, the x- and y-axes are marked in 0.200 µm segments, and the z-axis is marked in 35.00 µm segments. These atomic force microscope (AFM) images demonstrate the GCIB etch selectivity between Cu and barrier metal and hard mask material.

Figure 12:
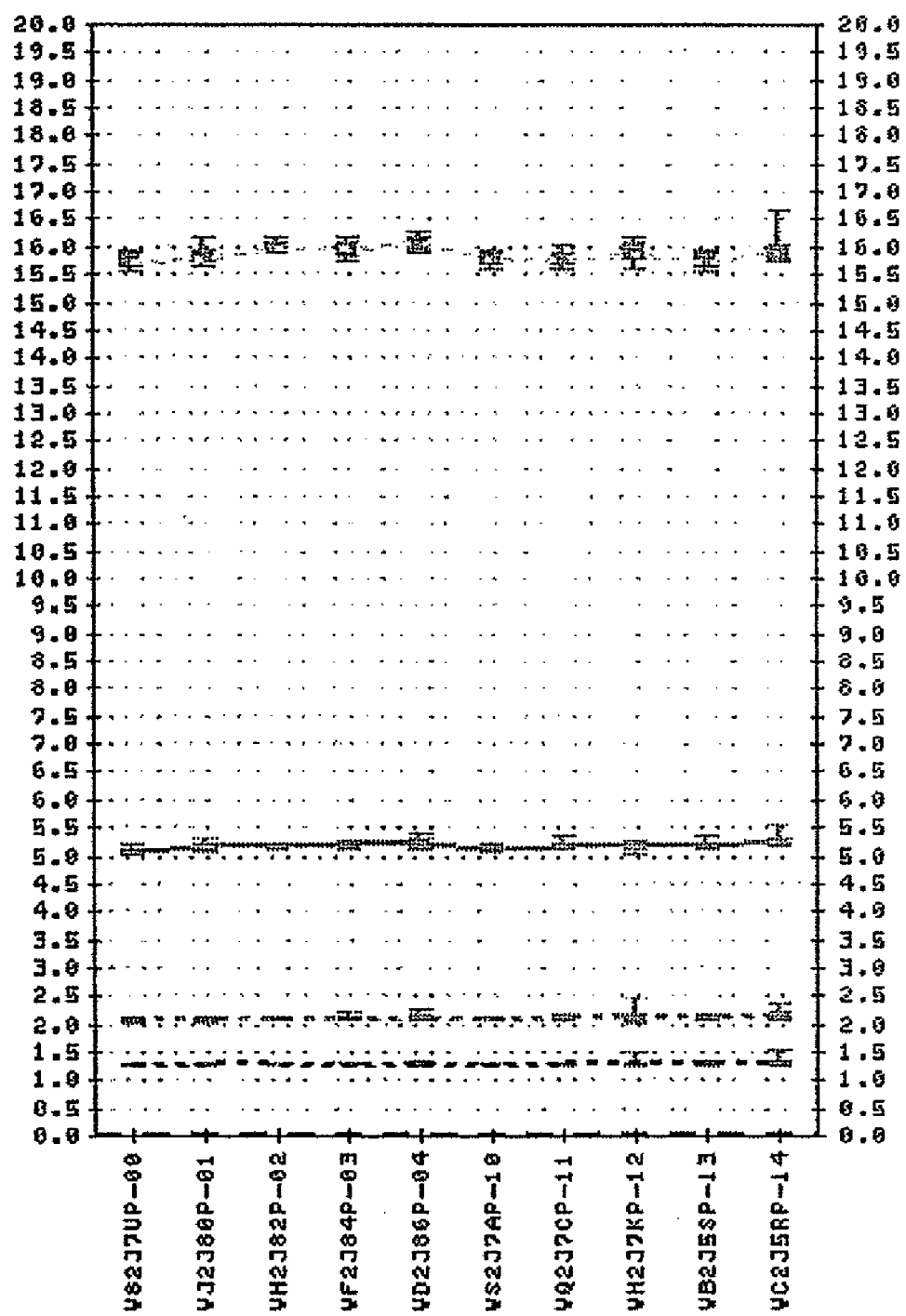
FIG. 12 is a graph showing the line resistance of nested lines formed using the inventive process.

FIG. 12 is a graph showing the line resistance of ten chips—each having nested lines with widths of 2.5 µm, 6 µm, 15 µm, and 25 µm, and having 50% pattern density—formed using the inventive process. Along the x-axis are the wafer IDs, and along the y-axis is the line resistance (in Ohms) distribution of multiple chips in a wafer. As can be seen from the graph, the line resistance on a wafer produced by the inventive process is substantially uniform as compared to conventional processes. As will be appreciated by one skilled in the art, it is desirable to have uniformity of resistance across the chip and wafer in order to optimize performance. More specifically, this graph shows a minimal variation of resistance as measured across the wafers.

While the invention has been described in terms of embodiments, those skilled in the art will recognize that the invention can be practiced with modifications and in the spirit and scope of the appended claims.

What is claimed is:

1. A method of manufacturing a structure, comprising:
   depositing a dielectric film layer, a hard mask layer, an anti-reflective coating and a patterned photo resist layer on a substrate;
   selectively etching the hard mask layer, anti-reflective coating and dielectric film layer by reactive ion or gas cluster ion beam (GCIB) etch processing to form openings in the dielectric film layer;
   stripping away remaining portions of the photo resist layer and the anti-reflective coating;
   depositing a barrier metal layer in the openings and on the hard mask layer and depositing a copper layer on the barrier metal layer;
   recessing the copper layer deposited on the barrier metal layer; and
   removing the barrier metal layer which was deposited on the hard mask layer and hard mask layer by GCIB processing to expose a surface of the dielectric film layer such that the dielectric film layer is planar with the copper layer.

2. The method of claim 1, wherein the recessing is performed by a chemical mechanical polish (CMP) step to remove excess copper from the surface prior to the GCIB.

3. The method of claim 1, wherein the dielectric film layer includes dense or porous material including Silicon Dioxide ($SiO_2$), Silicon Oxycarbide (SiCOH), Methylsilsesquioxane (MSQ), hydrogenated amorphous Silicon Carbide (SiCH), hydrogenated amorphous Silicon Carbo Nitride (SiCNH), or Silicon Nitride ($SiN_x$).

4. The method of claim 1, wherein the dielectric film layer may be comprised of multiple layers and has an upper layer that has a dielectric constant (K) ranging between 1.5 and 7.5.

5. The method of claim 1, wherein the dielectric film layer is deposited on the substrate by a process of one of plasma enhanced chemical vapor deposition (PECVD) or chemical vapor deposition (CVD) or spin-on.

6. The method of claim 1, wherein the barrier metal layer is one or a combination of Tantalum (Ta), Tantalum Nitride (TaN), and Ruthenium (Ru).

7. The method of claim 1, wherein the barrier metal layer is deposited by a process of one of chemical vapor deposition (CVD), physical vapor deposition (PVD) and atomic layer deposition (ALD).

8. The method of claim 1, wherein the GCIB etching is performed with an ion dose of approximately between 0.5 and 2.5 $E^{15}$ ion-clusters/cm$^2$.

9. The method of claim 1, wherein the GCIB etching gas includes a reactive gas and a carrier gas.

10. The method of claim 9, wherein the reactive gas comprises approximately between 1% and 100% of the GCIB etching gas.

11. The method of claim 9, wherein the carrier gas comprises approximately between 99% and 0% of the GCIB etching gas.

12. The method of claim 1, wherein the anti-reflective coating (ARC) is deposited over the hard mask layer.

13. The method of claim 12, wherein the selectively etching further comprises selectively etching the ARC and portions of the hard mask layer which align with the openings which form sublithographic features.

14. The method of claim 13, further comprises depositing the barrier metal layer on the remaining portions of the hard mask layer in the sublithographic features and over the barrier layer.

15. The method of claim 14, wherein the copper layer is deposited in the sublithographic features, over the barrier layer.

* * * * *